(12) United States Patent
Yang et al.

(10) Patent No.: US 8,620,234 B2
(45) Date of Patent: *Dec. 31, 2013

(54) HIGH EFFICIENCY LINEARIZATION POWER AMPLIFIER FOR WIRELESS COMMUNICATION

(75) Inventors: Dali Yang, Mountain View, CA (US); Jia Yang, Mountain View, CA (US)

(73) Assignee: Dali Systems Co., Ltd., George Town Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 13/301,224

(22) Filed: Nov. 21, 2011

(65) Prior Publication Data

US 2012/0135695 A1    May 31, 2012

Related U.S. Application Data

(63) Continuation of application No. 11/799,239, filed on Apr. 30, 2007, now Pat. No. 8,064,850, which is a continuation-in-part of application No. 11/262,079, filed on Oct. 27, 2005, which is a continuation of application No. 10/137,556, filed on May 1, 2002, now Pat. No. 6,985,704.

(60) Provisional application No. 60/795,820, filed on Apr. 28, 2006, provisional application No. 60/876,640, filed on Dec. 22, 2006, provisional application No. 60/897,746, filed on Jan. 26, 2007, provisional application No. 60/898,312, filed on Jan. 29, 2007.

(51) Int. Cl.
*H04B 1/04* (2006.01)

(52) U.S. Cl.
USPC .......................... 455/114.3; 375/296; 375/297

(58) Field of Classification Search
USPC .......... 455/114.3, 63.1, 126, 296, 127.2, 113, 455/114.2; 330/149; 375/296, 297
See application file for complete search history.

(56) References Cited

U.S. PATENT DOCUMENTS

| | | | |
|---|---|---|---|
| 4,638,248 | A | 1/1987 | Schweickert |
| 4,700,151 | A | 10/1987 | Nagata |
| 4,890,300 | A | 12/1989 | Andrews |
| 4,929,906 | A | 5/1990 | Voyce et al. |
| 5,049,832 | A | 9/1991 | Cavers |
| 5,105,445 | A | 4/1992 | Karam et al. |

(Continued)

OTHER PUBLICATIONS

Hilborn et al., "An Adaptive Direct Conversion Transmitter", IEEE Trans. on Vehicular Technology, vol. 43, No. 2 May 1994, pp. 223-233.

(Continued)

*Primary Examiner* — Edward Urban
*Assistant Examiner* — Golam Sorowar
(74) *Attorney, Agent, or Firm* — Kilpatrick Townsend & Stockton LLP

(57) ABSTRACT

A predistortion system for linearizing the output of a power amplifier includes a first signal representative of an RF modulated signal and a feedback signal representative of nonlinear characteristics of a power amplifier. The system also includes a predistortion controller, comprising at least one lookup table, adapted to receive the first signal and the feedback signal and to generate a correction factor for correcting the nonlinear characteristics of the power amplifier and combining logic which combines the RF modulated signal with a signal corresponding to the correction factor and supplies it to the power amplifier to linearize the output of the power amplifier.

16 Claims, 4 Drawing Sheets

(56) References Cited

U.S. PATENT DOCUMENTS

| | | | |
|---|---|---|---|
| 5,107,520 A | 4/1992 | Karam et al. | |
| 5,121,412 A | 6/1992 | Borth | |
| 5,132,639 A | 7/1992 | Blauvelt et al. | |
| 5,396,190 A | 3/1995 | Murata | |
| 5,486,789 A | 1/1996 | Palandech et al. | |
| 5,579,342 A | 11/1996 | Crozier | |
| 5,589,797 A | 12/1996 | Gans et al. | |
| 5,655,220 A | 8/1997 | Weiland et al. | |
| 5,675,287 A | 10/1997 | Baker et al. | |
| 5,678,198 A | 10/1997 | Lemson | |
| 5,699,383 A | 12/1997 | Ichiyoshi | |
| 5,732,333 A | 3/1998 | Cox et al. | |
| 5,757,229 A | 5/1998 | Mitzlaff | |
| 5,786,728 A | 7/1998 | Alinikula | |
| 5,870,668 A | 2/1999 | Takano et al. | |
| 5,920,808 A | 7/1999 | Jones et al. | |
| 5,936,464 A | 8/1999 | Grondahl | |
| 5,937,011 A | 8/1999 | Carney et al. | |
| 5,949,283 A | 9/1999 | Proctor et al. | |
| 5,959,499 A | 9/1999 | Khan et al. | |
| 5,963,549 A | 10/1999 | Perkins et al. | |
| 6,054,896 A | 4/2000 | Wright et al. | |
| 6,055,418 A | 4/2000 | Harris et al. | |
| 6,081,158 A | 6/2000 | Twitchell et al. | |
| 6,091,941 A | 7/2000 | Moriyama et al. | |
| 6,240,144 B1 | 5/2001 | Ha | |
| 6,242,979 B1 | 6/2001 | Li | |
| 6,246,286 B1 | 6/2001 | Persson | |
| 6,246,865 B1 | 6/2001 | Lee | |
| 6,252,912 B1 | 6/2001 | Salinger | |
| 6,275,685 B1 | 8/2001 | Wessel et al. | |
| 6,301,579 B1 | 10/2001 | Becker | |
| 6,313,703 B1 | 11/2001 | Wright et al. | |
| 6,314,142 B1 | 11/2001 | Perthold et al. | |
| 6,320,463 B1 | 11/2001 | Leva et al. | |
| 6,356,555 B1 | 3/2002 | Rakib et al. | |
| 6,373,902 B1 * | 4/2002 | Park et al. | 375/296 |
| 6,388,518 B1 | 5/2002 | Miyataini | |
| 6,400,774 B1 | 6/2002 | Matsuoka et al. | |
| 6,424,225 B1 | 7/2002 | Choi et al. | |
| 6,489,846 B2 | 12/2002 | Hatsugai | |
| 6,512,417 B2 | 1/2003 | Booth et al. | |
| 6,552,634 B1 | 4/2003 | Raab | |
| 6,625,429 B1 | 9/2003 | Yamashita | |
| 6,639,050 B1 | 10/2003 | Kieliszewski | |
| 6,677,870 B2 | 1/2004 | Im et al. | |
| 6,697,436 B1 | 2/2004 | Wright et al. | |
| 6,703,897 B2 | 3/2004 | O'Flaherty et al. | |
| 6,741,663 B1 | 5/2004 | Tapio et al. | |
| 6,741,867 B1 | 5/2004 | Tetsuya | |
| 6,747,649 B1 | 6/2004 | Sanz-Pastor et al. | |
| 6,751,447 B1 | 6/2004 | Jin et al. | |
| 6,885,241 B2 | 4/2005 | Huang et al. | |
| 6,963,242 B2 | 11/2005 | White et al. | |
| 6,983,025 B2 | 1/2006 | Schell | |
| 6,985,704 B2 | 1/2006 | Yang et al. | |
| 6,998,909 B1 | 2/2006 | Mauer | |
| 7,023,273 B2 | 4/2006 | Johnson et al. | |
| 7,035,345 B2 | 4/2006 | Jeckeln et al. | |
| 7,042,287 B2 | 5/2006 | Robinson | |
| 7,061,314 B2 | 6/2006 | Kwon et al. | |
| 7,064,606 B2 | 6/2006 | Louis | |
| 7,071,777 B2 | 7/2006 | McBeath et al. | |
| 7,079,818 B2 | 7/2006 | Khorram | |
| 7,098,734 B2 | 8/2006 | Hongo et al. | |
| 7,102,442 B2 | 9/2006 | Anderson | |
| 7,103,329 B1 | 9/2006 | Thon | |
| 7,104,310 B2 | 9/2006 | Hunter | |
| 7,106,806 B1 | 9/2006 | Kenington | |
| 7,109,792 B2 * | 9/2006 | Leffel | 330/149 |
| 7,109,998 B2 | 9/2006 | Smith | |
| 7,123,890 B2 * | 10/2006 | Kenington et al. | 455/127.2 |
| 7,151,913 B2 | 12/2006 | Ahmed | |
| 7,158,765 B2 | 1/2007 | Blair et al. | |
| 7,190,222 B2 | 3/2007 | Okazaki et al. | |
| 7,193,472 B2 | 3/2007 | Gotou et al. | |
| 7,248,642 B1 | 7/2007 | Vella-Coleiro | |
| 7,259,630 B2 | 8/2007 | Bachman et al. | |
| 7,321,635 B2 | 1/2008 | Ocenasek et al. | |
| 7,321,636 B2 | 1/2008 | Harel et al. | |
| 7,372,918 B2 | 5/2008 | Muller et al. | |
| 7,469,491 B2 | 12/2008 | McCallister et al. | |
| 7,831,221 B2 | 11/2010 | Leffel et al. | |
| RE42,287 E | 4/2011 | Apodaca et al. | |
| 8,064,850 B2 | 11/2011 | Yang et al. | |
| 2001/0051504 A1 * | 12/2001 | Kubo et al. | 455/63 |
| 2002/0025790 A1 | 2/2002 | Matsuoka | |
| 2002/0034260 A1 * | 3/2002 | Kim | 375/296 |
| 2002/0044014 A1 | 4/2002 | Wright et al. | |
| 2002/0080891 A1 * | 6/2002 | Ahn et al. | 375/297 |
| 2002/0101937 A1 | 8/2002 | Antonio et al. | |
| 2002/0101938 A1 | 8/2002 | Horaguchi et al. | |
| 2002/0179830 A1 | 12/2002 | Pearson et al. | |
| 2002/0187761 A1 * | 12/2002 | Im et al. | 455/126 |
| 2002/0193085 A1 | 12/2002 | Mathe et al. | |
| 2002/0193087 A1 | 12/2002 | Kim | |
| 2003/0095608 A1 | 5/2003 | Duperray | |
| 2003/0098752 A1 * | 5/2003 | Haghighat | 332/103 |
| 2003/0112068 A1 | 6/2003 | Kenington | |
| 2003/0179829 A1 | 9/2003 | Pinckley et al. | |
| 2003/0179830 A1 | 9/2003 | Eidson et al. | |
| 2004/0017859 A1 | 1/2004 | Sills et al. | |
| 2004/0142667 A1 | 7/2004 | Lochhead et al. | |
| 2004/0180634 A1 * | 9/2004 | Kenington et al. | 455/113 |
| 2004/0240585 A1 | 12/2004 | Bishop et al. | |
| 2005/0079834 A1 | 4/2005 | Maniwa et al. | |
| 2005/0159117 A1 | 7/2005 | Bausov et al. | |
| 2005/0226346 A1 * | 10/2005 | Ode et al. | 375/296 |
| 2005/0262498 A1 | 11/2005 | Ferguson et al. | |
| 2006/0012426 A1 | 1/2006 | Nezami | |
| 2006/0046665 A1 | 3/2006 | Yang et al. | |
| 2006/0067426 A1 | 3/2006 | Maltsev et al. | |
| 2006/0109052 A1 | 5/2006 | Saed et al. | |
| 2006/0121858 A1 | 6/2006 | Tanaka et al. | |
| 2006/0217083 A1 * | 9/2006 | Braithwaite | 455/114.3 |
| 2006/0238245 A1 | 10/2006 | Carichner et al. | |
| 2006/0240786 A1 * | 10/2006 | Liu | 455/114.3 |
| 2006/0270366 A1 | 11/2006 | Rozenblit et al. | |
| 2007/0075780 A1 | 4/2007 | Krvavac et al. | |
| 2007/0171234 A1 | 7/2007 | Crawfis et al. | |
| 2007/0190952 A1 | 8/2007 | Waheed et al. | |

OTHER PUBLICATIONS

Faukner et al., "Adaptive Linearization Using Predistortion—Experimental Results", IEEE Trans. on Vehicular Technology, vol. 43, No. 2, May 1994, pp. 323-332.

Cavers, "Adaptive Behavioue of a Feed-Forward Amplifier Linearizer", IEEE Trans. on Vehicular Technology, vol. 44, No. 1, Feb. 1995, pp. 31-40.

Cavers, "Amplifier Linearization Using Digital Predistorter With Fast Adaptation and Low Memory Requirements", IEEE Trans. on Vehicular Technology, vol. 39, No. 4, Nov. 1990, pp. 374-382.

Nagata, "Linear Amplification Technique for Digital Mobile Communications", in Proc. 39th IEEE Vehicular Technology Conference, San Francisco, CA 1989, pp. 159-165.

Bernardini et al., "Analysis of Different Optimization Criteria for IF Predistortion in Digital Radio Links With Nonlinear Amplifiers", IEEE Trans. on Communications, vol. 45, No. 4, Apr. 1997.

Santella, "Performance of Adaptive Predistorters in Presence of Orthogonal Multicarrier Modulation", International Conference on Telecommunications, pp. 621-626, Melbourne, Australia, Apr. 2-5, 1997.

Office Action for related Chinese patent application No. 200780023875.1 dated Dec. 23, 2011, 6 pages.

Non-Final Office Action for U.S. Appl. No. 10/137,556 mailed on Dec. 2, 2004, 8 pages.

Notice of Allowance for U.S. Appl. No. 10/137,556 mailed on Jul. 6, 2005, 14 pages.

Final Office Action for U.S. Appl. No. 11/262,079 mailed on May 4, 2009, 13 pages.

(56) References Cited

OTHER PUBLICATIONS

Non-Final Office Action for U.S. Appl. No. 11/262,079 mailed on Aug. 29, 2008, 11 pages.
Non-Final Office Action for U.S. Appl. No. 11/799,239 mailed on Oct. 29, 2009, 11 pages.
Non-Final Office Action for U.S. Appl. No. 11/262,079 mailed on Dec. 11, 2009, 16 pages.
Final Office Action for U.S. Appl. No. 11/799,239 mailed on Jun. 24, 2010, 10 pages.
Notice of Allowance for U.S. Appl. No. 11/799,239 mailed on Sep. 22, 2011, 7 pages.
Non-Final Office Action for U.S. Appl. No. 11/262,079 mailed on Mar. 26, 2012, 17 pages.
Non-Final Office Action for U.S. Appl. No. 11/962,025 mailed on Jul. 9, 2010, 32 pages.
Final Office Action for U.S. Appl. No. 11/962,025 mailed on Feb. 16, 2011, 17 pages.
Non-Final Office Action for U.S. Appl. No. 11/962,025 mailed on May 24, 2012, 14 pages.
Non-Final Office Action for U.S. Appl. No. 11/962,025 mailed on Sep. 28, 2012, 9 pages.

* cited by examiner

Figure 1    Predistortion and Linearization PA Module

Figure 2    Predistortion Controller Architecture

HIGH EFFICIENCY LINEARIZATION POWER AMPLIFIER FOR WIRELESS COMMUNICATION

CROSS-REFERENCES TO RELATED APPLICATIONS

This application is a continuation of U.S. patent application Ser. No. 11/799,239, filed on Apr. 30, 2007, Now U.S. Pat. No. 8,064,850, which is a continuation-in-part of U.S. patent application Ser. No. 11/262,079, filed on Oct. 27, 2005, now U.S. Pat. No. 8,326,238, which is a continuation of U.S. patent application Ser. No. 10/137,556, filed May 1, 2002, now U.S. Pat. No. 6,985,704. The disclosures of each are hereby incorporated by reference in their entirety for all purposes.

BACKGROUND OF THE INVENTION

A fundamental component of wireless communications systems is the power amplifier (PA). Such wireless communications systems include a variety of broadband and multimedia services. In such systems, the power amplifier is supported by a wireless RF transmitter. The power efficiency of the PA is an important aspect of the operational efficiency of the system as a whole. For a long time, the linearity and efficiency of power amplifiers have been two of the most difficult issues faced by wireless system designers and users. These problems are closely related to both the power spectrum efficiency and the power efficiency of power amplifiers.

Prior art predistortion technologies used to linearize the PA in wireless communication systems mainly use analog predistortion approaches. Some have also used a digital adjustment component implemented by means of an analog feedforward approach and a digital predistortion approach employing a base-band digital signal processing (DSP) technique.

The traditional analog predistortion technologies are based on the principle of error subtraction and a power match to linearize the PA. These approaches must use an auxiliary power amplifier to match exactly the non-linearity of the main PA and, at the same time, overcome the signal time-delay that is a variable with frequency and environmental temperature. As a result, it is difficult for this approach to meet the requirement of the advanced wireless communication systems.

Prior art DSP-based predistortion methods generally require that the predistortion sub-system and circuit design rely on the I and Q signal of the base band in the base station, and therefore have to embed the predistortion processing into the base band circuits of the base station. This requires that the existing base band circuit in the base station must be modified, which is an inconvenient high-cost solution for wireless carriers and equipment makers. Also, the typical DSP-based predistortion technology is not suitable to linearization of the PA when multi-modulation schemes and multi-carrier signals go through a PA.

SUMMARY OF THE INVENTION

The present invention includes methods and apparatus for improving power efficiency and linearity of a PA by predistorting the input signal to the PA. By applying the methods of the present invention to pre-distort the signal, the conversion characteristic of the normally nonlinear PA becomes substantially linear. As a result, the PA uses power more efficiently and provides advanced performance characteristics suitable for wireless signal transmission. The present invention can be applied to a broad array of wireless communication systems, regardless of modulation type, to yield high quality signal transmission and expanded network capacity. It will be appreciated by those skilled in the art that the power amplifiers described herein can also be regarded as high power amplifiers.

In an embodiment of the invention, a predistortion controller comprises analog peripheral circuits and a predistortion core processor for RF signal predistortion processing in preparation for PA signal transmission from a wireless communication device.

The analog peripheral circuits in the predistortion controller comprise the analog down-converter circuits prior to the PA input and the output of the PA, respectively, to pick up and compare an idealized signal from the modulator in the wireless system to the distorted feedback signal from PA's output. The predistortion core processor operates together with a look-up table, where the look-up table stores predistortion information that is obtained by mathematically calculating AM-AM and AM-PM distortion components. The output of the predistortion processor provides a pre-correction signal for the input of the PA. The precorrection signal is combined with the signal from the RF modulator by a multiplication operation to generate a pre-distorted input signal that is provided as the input to the PA.

The basic architecture of the predistortion sub-system can be better understood from the appended Figures, as set forth below.

DETAILED DESCRIPTION OF THE INVENTION

The present invention relates generally to wireless communications systems, and more particularly relates to systems, apparatus and methods for correcting the nonlinearity of a Power Amplifier (PA) such as might be used in a wireless RF transmitter.

The present invention provides a novel predistortion controller to linearize the power amplifier (PA) used in wireless base stations operating in wireless networks using a wide variety of signal types including CDMA, TDMA, GSM, GPRS, 3G systems (UMTS, W-CDMA, CDMA2000, TDS-CDMA, 3GPP and others), WLAN, WiFi, WiMax and the like, as well as other proposed and upcoming wireless systems (4G/5G) that transmit a complex modulated signal by using a high power amplifier. Because the high power amplifier in wireless RF transmitters typically distorts the RF output signal, the adaptive predistortion controller of the present invention is useful to correct that non-linearity. Embodiments of the present invention are suitable for use with all wireless base stations, access points and other wireless communication systems such as microwave and satellite communications. The predistortion controller of the present invention offers the additional advantage that it can be added to existing wireless RF transmitters without otherwise changing or modifying the base station structure while at the same time yielding significant performance improvements. Included in these improvements is a substantial increase in the efficiency of the base station, which yields a significant reduction in power usage because, in current systems, significant power is wasted due to the nonlinear characteristics of typical PA's.

From the following description, it will be appreciated that the high-efficiency linearization predistortion controller disclosed herein offers the following benefits to the wireless industry:

1. It significantly enhances the transmitted signal quality and increases wireless network capacity by improving the PA's transmission characteristics and decreasing the adjacent channel interference.

2. It can be implemented as an add-on module to the PA, which permits the aforementioned improvements to the performance of the PA without changing or modifying the existing RF and base band circuits in the base station. This differs from the traditional feedback and feed-forward predistortion approach, and therefore is a comparatively low cost, easy to install solution for the wireless network infrastructure whenever the operators desire to upgrade performance and reduce energy costs.

3. The predistortion control operation is fast and dynamic, which permits it to track and correct for nonlinearities of the PA in a wider, and makes it particularly suitable for use in base stations, repeaters and handsets.

4. It can be integrated into the design of the PA for convenient installation and replacement of aging PA's already installed in a wireless system.

Figure 1:
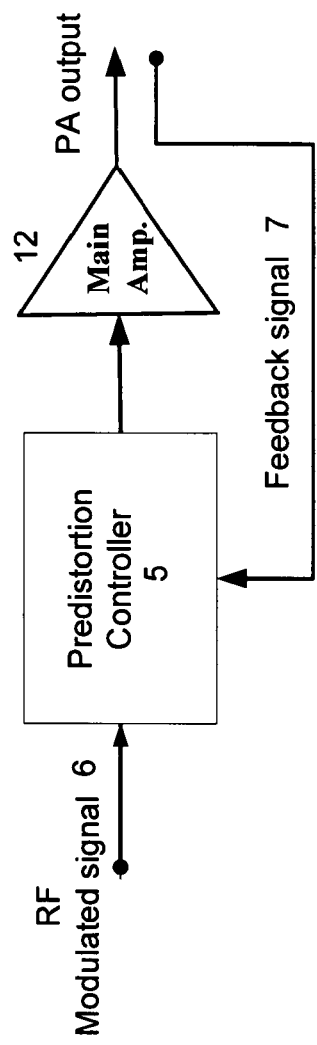
FIG. 1 shows a block diagram of the PA module with a predistortion controller in accordance with an embodiment of the invention.

Referring first to FIG. 1, the basic arrangement of the present invention can be appreciated. A predistortion controller 5 received as an input a modulated RF signal 6 and also receives a feedback signal 7 which correlates to the output signal of a power amplifier 12. The predistortion controller modifies the RF signal 6 in accordance with the nonlinear and distortion characteristics of the output signal of the power amplifier 12 as characterized by the feedback signal 7, such that the output of the predistortion controller 5 is supplied to the power amplifier 12 to yield a substantially linearized and improved out put signal of the power amplifier 12.

Figure 2:
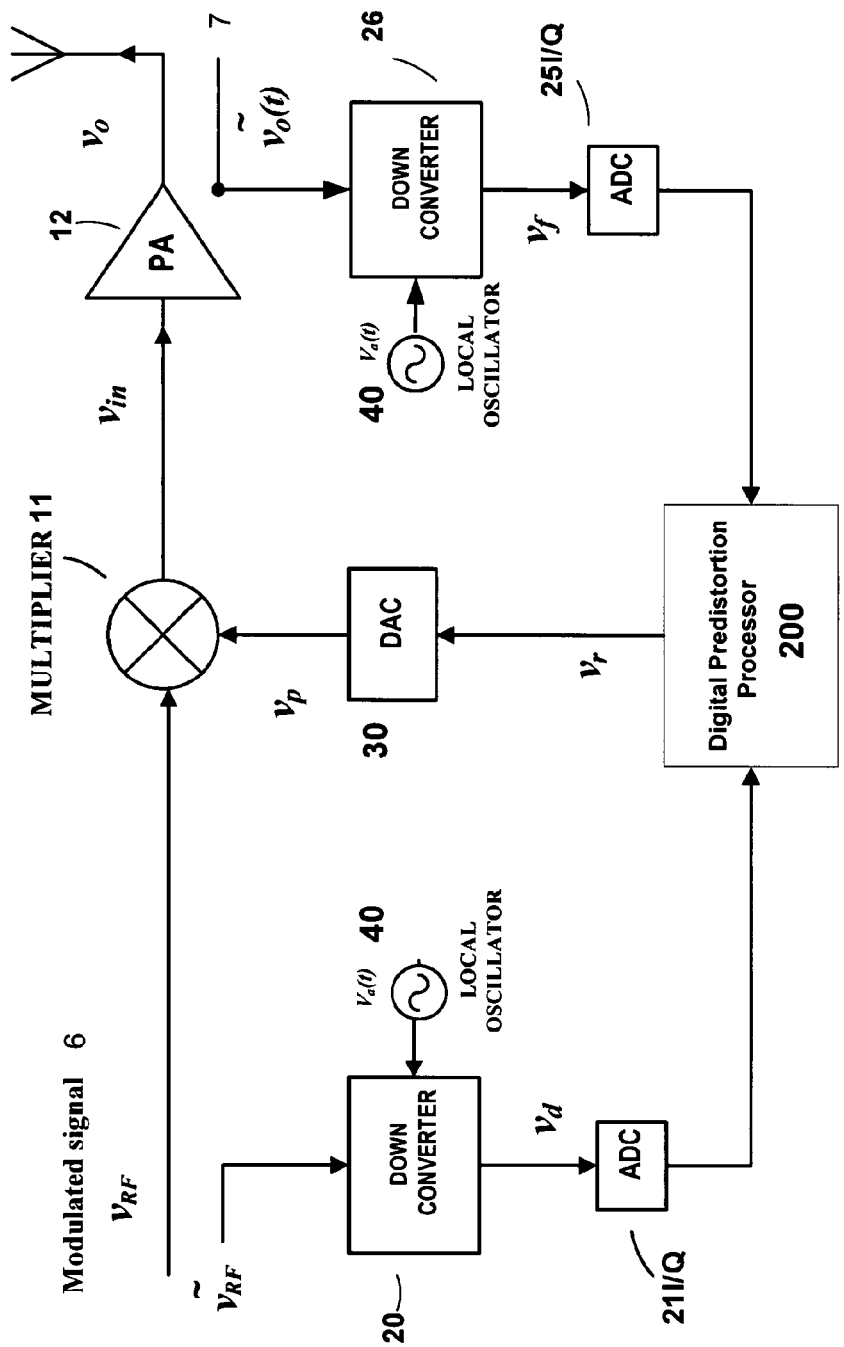
FIG. 2 presents a simplified architecture of an embodiment of the predistortion controller of FIG. 1.
Figure 3:
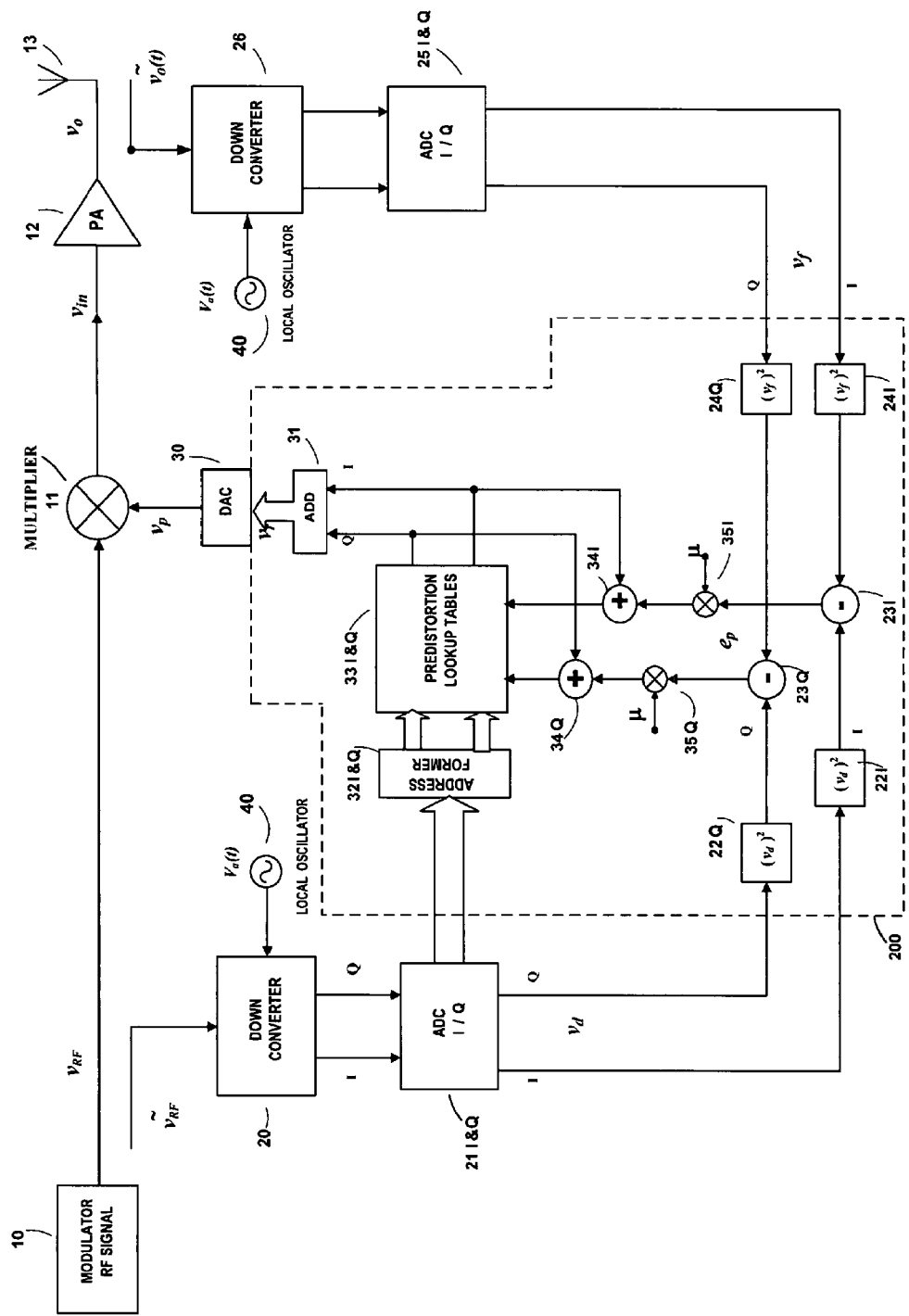
FIG. 3 illustrates in greater detail the embodiment of FIG. 2.

Referring next to FIGS. 2 and 3, an embodiment of the present invention may be appreciated in greater detail. More particularly, the illustrated embodiment includes an Analog Multiplier 11 which receives a modulated RF signal $V_{RF}$ from the RF modulator portion 10 [FIG. 3] of the base station, and also receives a predistortion correction signal $V_p$ from a predistortion processor 200, shown generally in FIG. 2 and in greater detail in FIG. 3, and discussed in greater detail below. The output of the analog multiplier 11 is provided as the input $V_{in}$ to the power amplifier (PA) 12, which in turn transmits an output signal $V_o$ to an Antenna 13. The RF modulator 10 is typically although not necessarily a quadrature modulator or an orthogonal modulator. It will be appreciated that multiplier 11 can be implemented as multiple multipliers, each associated with one or more quadrature signals.

An input down-converter circuit 20 receives an idealized reference signal $V_{RF}$ from modulator in base station, and is biased by a local oscillator 40, such that it provides an output $V_{ct}$ to an analog-to-digital converter 21. The ADC 21 converts the signal $V_{ct}$ to digital form, whereupon it is provided as one input to a Digital Predistortion Processor 200.

A feedback down-converter circuit 26, also biased by a local oscillator 40, receives a raw feedback signal $V_o(t)$ from the output of the PA, and provides a feedback signal $V_f$ to an feedback ADC 25. The digital output of the ADC 25 then provides a second input, i.e., feedback signal, to the Digital Predistortion Processor 200. The Digital Predistortion Processor 200, discussed in greater detail below, provides a digital output signal $V_r$ to a DAC 30, which converts the digit signal to an analog form, where it is combined with the modulated RF signal in the multiplier 11.

As shown in FIG. 3, address data formers 32I-32Q receive inputs from the ADC 21I/Q, and are designed to generate the required signal format for a lookup table 33I/Q. The data formers 32I/Q address memory units within the lookup tables 33I/Q, where the lookup table provides separate I and Q outputs to an adder 31. It will be appreciated that the lookup table 33 can be implemented as one or more lookup tables. The address provided by the address formers 32I-32Q can be considered a lookup-table key or address.

The predistortion controller lookup tables 33I-33Q are designed memory units to store the predistortion signal for high power amplifier linearization. The predistortion signals in the tables are based on the error generated by a comparison of the ideal signal $V_d$ and the feedback signal $V_f$ and the presented adaptive algorithm. The data stored in the tables 33I-Q can be updated by adaptive iteration as described hereinafter, and forms digitally indexed data reflecting the nonlinear characteristics of the power amplifier.

By comparison of AM-AM and AM-PM information between the idealized signal $V_{RF}(t)$ and the feedback signal Vo(t), the Digital Predistortion Processor calculates the error in the amplitude and phase components of the output signal $V_o(t)$ caused by the non-linear transmission characteristics of the high power amplifier 12.

Based on the error information obtained by the foregoing comparison, the predistortion processor, based on the lookup table algorithm disclosed in U.S. Pat. No. 6,985,704, the disclosure of which is hereby incorporated by reference, calculates and generates adaptively a compensation signal that is of inverse characteristics with the transform function of the PA 12 to pre-distort the AM-AM and AM-PM distortion caused by the PA 12.

The outputs $V_p$ of the predistortion lookup table 33I-33Q are fed to multiplier 11, after an adder 31 and a digital-to-analog converter 30, to modify the modulated RF signal from modulator 10. The output of the multiplier is the required predistortion signal $V_{in}(k)$ that is of an inverse non-linearity with that of the power amplifier 12 to yield a pre-compensation to the input of high power amplifier.

It will be appreciated by those skilled in the art that there can be a signal difference between two signals, ideal signal $V_{RF}$ and feedback signal, $V_o(t)$, when they arrive at predistortion controller 5 [FIG. 1], or, in FIG. 2, at processor 200. The time difference results from the time-delay differences between the two signals, which is caused by the different paths each travels in arriving at the processor 200. This signal time-delay can vary randomly based on the parameters of the circuits and parts, as well as other environmental factors. The result is that it is difficult to estimate, calculate and adjust for such signal differences in the field application environment. To overcome this issue, the present invention adaptively adjusts for this time-delay through the use of an algorithm taught by the previously cited U.S. Pat. No. 6,985,704.

The use of the look-up tables 33 permits a memory function to be introduced into at least some embodiments of the present invention. The lookup table of the predistortion controller is based on a stored compensation principle that maps a set of input data into a digital output, and updated adaptively. Based on the stored function, each output signal of lookup table is actually related to both the current and the previously transmitted signal, and therefore has a memory function which compensate not only for the non-linearity of the PA, but also avoids the need for a special time-delay compensation circuit such as typically used in the prior art. See particularly U.S. Provisional Patent Application No. 60/898,312, filed Jan. 29, 10 2007, entitled Power Amplifier Time-delay Invariant Predistortion Methods and Apparatus.

The architecture of an embodiment of a lookup table which can implement the compensation principle discussed above is shown in FIG. 4. The data from ADC 21 is supplied to address former 32, which in turn forms an address and applies it to the look-up tables 33. At the same time, the feedback signal $V_{feedback}$ from ADC 25 and the ideal signal $V_{ideal}$ from ADC 21 are compared in the error generator 23 and the resulting error signal is multiplied by a numerical value I1 in multiplier 35. The value of I1 is typically between 0 and 1, and represents a convergence factor that can be better understood from the teachings in U.S. Pat. No. 6,985,704. The scaled error factor is then added with a feedback factor in adder 34 and supplied back to the lookup table 33. The result is an output of the lookup table which provides compensation for the time delay as well as nonlinearities of the PA 12.

Due to introducing the memorized lookup table processing, there is unnecessary to build another special time-delay circuit for the signal delay processing. Therefore, the memorized lookup table in this patent shows two functions, the nonlinear predistortion of high power amplifier and adaptive signal time-delay adjusting.

Figure 4:
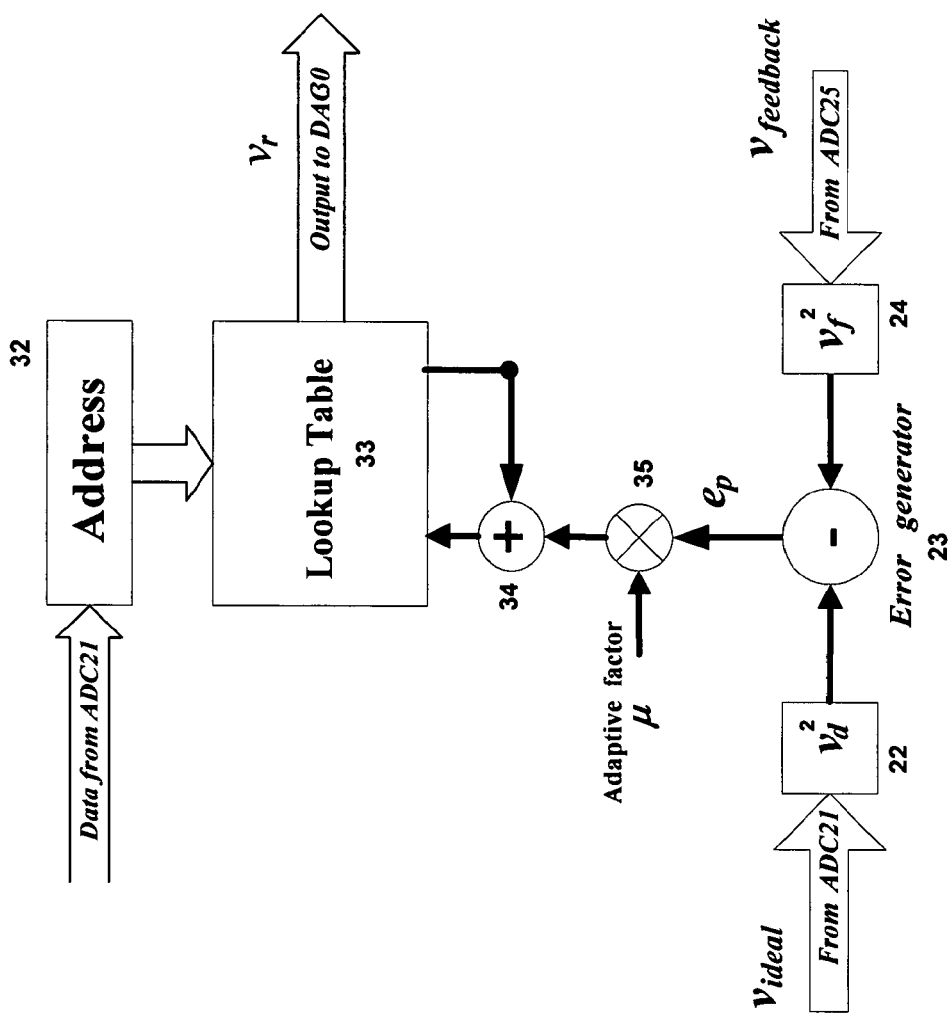
FIG. 4 shows the operation and arrangement of the lookup table in the predistortion controller shown in FIG. 3.

The lookup table of predistortion controller is based on a stored compensation principle that maps a set of input data into a digital output, and are updated adaptively. Based on the stored function, each output signal of lookup table is actually related to both the current and previous transmitted signal, and therefore has a memory function when compensate the non-linearity of PA [1]. The architecture of lookup table based on the compensation principle is shown in FIG. 4.

It will be appreciated further that the performance of the predistortion controller is, in some respects, related to the number of bits in the analog-to-digital converters in the original and feedback channels, whereby the bigger the number of bits in the ADC, the better the performance or the predistortion controller is. Similarly, the memory function of the predistortion controller is also related to the number of bits in the address-shifting register, such that, within reasonable sizes, the performance of the predistortion controller improves as the number of bits in the register increases. It will further be appreciated that the PA may be operated in any region, such that, for example, its bias or static operation point can be set either in the saturation region or the cut-off region, with appropriate adjustments for operation in each region. It will further be appreciated that the output signal of predistortion controller is a stochastic control signal rather than a modulated high-frequency signal, and the signal is of the inverse characteristic with the AM-AM and AM-PM distortion component of power amplifier. Those skilled in the art will also appreciate that the output signal of the predistortion controller is not a high-frequency signal, and its frequency typically match the bandwidth of the signal to be transmitted by a power amplifier in a wireless transmitter.

The combination of both memory and store function performed by the lookup table extends the ability of the present system to compensate for the PA's non-linear characteristics to time-independent aspects. The time-independent feature of the lookup table's adaptive processing is a key benefit of the addressing arrangement of the lookup table. In an embodiment, the addressing of the lookup table is implemented by a set of N-bit vector data that contains the current input signal and previous N input signal as well. Therefore, the address of the lookup table is a combination of series of input sequences with the length of N. The longer the address of the lookup table, the wider the time-delay information range that the system can accommodate (i.e. the longer duration of time-delay effects that the system can tolerate).

Having described the invention in detail, including several embodiments and alternatives, those skilled in the art will appreciate that numerous other alternatives and equivalents exist which are within the scope of the present invention. Therefore the invention is intended not to be limited by the above description, but rather only by the appended claims.

What is claimed is:

1. A predistortion system for linearizing an output of a power amplifier, the predistortion system comprising:
    a first input operable to receive an analog RF modulated signal;
    a second input operable to receive a feedback signal representative of nonlinear characteristics of a power amplifier;
    a predistortion controller, comprising at least one lookup table, adapted to receive a digitized version of the analog RF modulated signal and a digitized version of the feedback signal and to generate a correction factor for correcting the nonlinear characteristics of the power amplifier;
    combining logic which combines the analog RF modulated signal with a signal corresponding to the correction factor and supplies it to the power amplifier to linearize the output of the power amplifier;
    a first A-to-D converter coupled to the analog RF modulated signal and operable to generate a first quadrature signal; and
    a second A-to-D converter coupled to the feedback signal and operable to generate a second quadrature signal, wherein the correction factor is equal to the square of the first quadrature signal minus the square of the second quadrature signal.

2. The predistortion system of claim 1 wherein the combining logic comprises an analog multiplier.

3. The predistortion system of claim 1 further comprising error logic operable to determine an error between the digitized version of the analog RF modulated signal and the digitized version of the feedback signal.

4. The predistortion system of claim 3 further comprising a multiplier operable to multiple the error by an adaptive factor.

5. The predistortion system of claim 1 wherein the predistortion controller further comprises an address former responsive to the digitized version of the analog RF modulated signal and operable to generate an address supplied to the at least one look-up table.

6. The predistortion system of claim 1 wherein the predistortion controller further comprises an adder operable to provide an entry to the at least one lookup table, wherein the adder receives a scaled error and a previous entry to the at least one lookup table.

7. The predistortion system of claim 1 wherein the at least one lookup table is at least two lookup tables.

8. The predistortion system of claim 7 wherein each of the at least two lookup tables are associated with different operating parameters.

9. A method for linearizing an output of a power amplifier, the method comprising:
    receiving an analog RF modulated signal at an input of a predistortion controller;
    receiving a feedback signal representative of nonlinear characteristics of the power amplifier;
    generating a correction factor associated with the nonlinear characteristics of the power amplifier;

combining the analog RF modulated signal with the correction factor to provide a power amplifier input signal;

receiving the power amplifier input signal at an input of the power amplifier;

generating a first quadrature signal using a first A-to-D converter coupled to the digitized version of the RF modulated signal; and generating a second quadrature signal using a second A-to-D converter coupled to the feedback signal, wherein the correction factor is equal to the square of the first quadrature signal minus the square of the second quadrature signal.

10. The method of claim 9 wherein combining the analog RF modulated signal with the correction factor comprises using an analog multiplier.

11. The method of claim 9 further comprising determining an error between a digitized version of the RF modulated signal and the feedback signal.

12. The method of claim 11 further comprising multiplying the error by an adaptive factor.

13. The method of claim 9 wherein generating the correction factor comprises adding a scaled error and a previous entry to at least one lookup table to provide an entry to the at least one lookup table.

14. The method of claim 13 further comprising generating an address supplied to the at least one lookup table using an address former responsive to the analog RF modulated signal.

15. The method of claim 13 wherein the at least one lookup table is at least two lookup tables.

16. The method of claim 15 wherein each of the at least two lookup tables are associated with different operating parameters.

* * * * *